(12) United States Patent
Borisov et al.

(10) Patent No.: US 12,021,464 B2
(45) Date of Patent: Jun. 25, 2024

(54) ADAPTIVE LOGIC BOARD FOR VARIABLE SPEED DRIVE

(71) Applicants: Johnson Controls Technology Company, Auburn Hills, MI (US); Johnson Controls Air Conditioning And Refrigeration (WuXi) Company, LTD., Wuxi New District (CN)

(72) Inventors: Konstantin Alex Borisov, York, PA (US); JonPaul Warriner, York, PA (US); Chenyi Jiang, Wuxi (CN); Anuradha Girish Ogale, York, PA (US); Fei Lu, Wuxi (CN)

(73) Assignees: Tyco Fire & Security GmbH, Neuhausen am Rheinfall (CH); Johnson Controls Air Conditioning and Refrigeration (Wuxi) Co., Ltd., Jiangsu (CN)

( * ) Notice: Subject to any disclaimer, the term of this patent is extended or adjusted under 35 U.S.C. 154(b) by 949 days.

(21) Appl. No.: 16/970,606

(22) PCT Filed: Feb. 9, 2019

(86) PCT No.: PCT/US2019/018604
§ 371 (c)(1),
(2) Date: Aug. 17, 2020

(87) PCT Pub. No.: WO2019/161399
PCT Pub. Date: Aug. 22, 2019

(65) Prior Publication Data
US 2021/0091698 A1  Mar. 25, 2021

Related U.S. Application Data

(60) Provisional application No. 62/632,303, filed on Feb. 19, 2018.

(51) Int. Cl.
*H02P 23/14* (2006.01)
*F24F 11/49* (2018.01)
*F24F 11/89* (2018.01)
*G01R 15/14* (2006.01)

(52) U.S. Cl.
CPC .............. *H02P 23/14* (2013.01); *F24F 11/49* (2018.01); *F24F 11/89* (2018.01); *G01R 15/146* (2013.01)

(58) Field of Classification Search
CPC ....... H02P 23/14; H02P 2205/01; F24F 11/49; F24F 11/89; F24F 11/88; F24F 11/63;
(Continued)

(56) References Cited

U.S. PATENT DOCUMENTS 3,801,887 A * 4/1974 Allard .................. H02P 25/024
327/449
5,206,521 A 4/1993 Ruiz et al.
(Continued)

FOREIGN PATENT DOCUMENTS

CN  107681630 A  2/2018
EP  2072923 A1  6/2009
(Continued)

OTHER PUBLICATIONS

International Search Report and Written Opinion for PCT Application No. PCT/US2019/018604, dated Jun. 17, 2019, 19 pgs.
(Continued)

*Primary Examiner* — Christopher P McAndrew
*Assistant Examiner* — Zannatul Ferdous
(74) *Attorney, Agent, or Firm* — Fletcher Yoder, PC

(57) ABSTRACT

The present disclosure relates to an adaptive logic board that includes a signal sensing circuit configured to receive an input signal as an electrical current. The signal sensing circuit includes a plurality of resistors and a plurality of switches configured to electrically couple or electrically
(Continued)

decouple the plurality of resistors from the signal sensing circuit, in which each switch of the plurality of switches corresponds to a corresponding resistor of the plurality of resistors. The adaptive logic board also includes a sensing unit that is configured to measure a voltage drop of the input signal across an active resistor of the plurality of resistors.

10 Claims, 10 Drawing Sheets

(58) Field of Classification Search
CPC .. F24F 11/86; G01R 15/146; F25B 2339/047; F25B 2400/13; F25B 2600/021; F25B 41/39; Y02B 30/70; H02M 5/40
See application file for complete search history.

(56) References Cited

U.S. PATENT DOCUMENTS

| | | | | |
|---|---|---|---|---|
| 2005/0212505 | A1* | 9/2005 | Murray | G01R 19/16547 |
| | | | | 324/126 |
| 2007/0152676 | A1* | 7/2007 | Lee | H02P 23/0004 |
| | | | | 324/522 |
| 2012/0199660 | A1* | 8/2012 | Warren | G05B 13/0265 |
| | | | | 236/1 C |
| 2016/0282005 | A1 | 9/2016 | Kim et al. | |
| 2017/0201201 | A1* | 7/2017 | Aoki | H02P 6/16 |

FOREIGN PATENT DOCUMENTS

| | | |
|---|---|---|
| EP | 3136006 A1 | 3/2017 |
| JP | H05215791 A | 8/1993 |
| JP | 2003510575 A | 3/2003 |
| JP | 2009521903 A | 6/2009 |
| JP | 2012244756 A | 12/2012 |

OTHER PUBLICATIONS

Japanese Office Action for JP Application No. 2020-566533, dated Feb. 21, 2022, 3 pgs.

Chinese Office Action for CN Application No. 201980020083.1, dated May 8, 2021, 6 pgs.

* cited by examiner

ADAPTIVE LOGIC BOARD FOR VARIABLE SPEED DRIVE

CROSS-REFERENCE TO RELATED APPLICATIONS

This application is a U.S. National Stage Application of PCT International Application No. PCT/US2019/018604, entitled "ADAPTIVE LOGIC BOARD FOR VARIABLE SPEED DRIVE," filed Feb. 19, 2019, which claims priority to and the benefit of U.S. Provisional Application Ser. No. 62/632,303, entitled "ADAPTIVE LOGIC BOARD FOR VARIABLE SPEED DRIVE," filed Feb. 19, 2018, each of which is herein incorporated by reference in its entirety for all purposes.

BACKGROUND

The present disclosure relates generally to variable speed drives for heating, ventilation, air conditioning, and refrigeration systems, and more particularly, to an adaptive logic board for a variable speed drive.

Chiller systems for applications in commercial or industrial heating, ventilation, air conditioning, and refrigeration (HVAC&R) systems typically include relatively large motors for powering a compressor. A power output of the motors may be selected based on a capacity (e.g., a cooling demand) of the HVAC&R system. For example, the power output of the motors may range in horsepower (HP) from 100 HP to 5,000 HP, or greater than 5,000 HP. Many of these systems include a variable speed drive (VSD) for controlling a speed of the motor in response to variations in the cooling demand of the system. The VSD may increase the speed of the motor and, thus, a speed of the compressor, when the cooling demand of the HVAC&R system is increased. Conversely, the VSD may decrease the speed of the motor when the cooling demand of the HVAC&R system is decreased.

A threshold power output of the motor may determine a size (e.g., a power output range) of the VSD. For example, a relatively high powered motor may be controlled by a VSD capable of supporting a higher current draw and voltage demand than a VSD controlling a relatively low powered motor. Accordingly, several sizes of VSDs may be included in the HVAC&R system to accommodate motors operating over a wide power output range. Each size of VSD may include a printed circuit board (e.g., a logic board) that monitors or controls certain operational parameters (e.g., current output, voltage output) of the respective VSD. Unfortunately, manufacturing different logic boards for each size of VSD may complicate production and increase manufacturing costs of the logic boards.

SUMMARY

The present disclosure relates to an adaptive logic board that includes a signal sensing circuit configured to receive an input signal as an electrical current. The signal sensing circuit includes a plurality of resistors and a plurality of switches configured to electrically couple or electrically decouple the plurality of resistors from the signal sensing circuit, in which each switch of the plurality of switches corresponds to a corresponding resistor of the plurality of resistors. The adaptive logic board also includes a sensing unit that is configured to measure a voltage drop of the input signal across an active resistor of the plurality of resistors.

The present disclosure also relates to a method of operating a variable speed drive (VSD) using an adaptive logic board, which includes determining a size of the VSD based at least in part on a power output range of the VSD. The method also includes electrically coupling a resistor of a plurality of resistors to a signal sensing circuit of the adaptive logic board, where the resistor is an active resistor. The method further includes generating an electrical signal using one or more current transducers coupled to power lines of the VSD, where a magnitude of the electrical signal is proportional to a magnitude of an electrical current flowing through the power lines. The method also includes instructing the VSD to adjust the magnitude of the electrical current flowing through the power lines based at least in part on the electrical signal of the one or more current transducers.

The present disclosure also relates to a heating, ventilation, air conditioning, and refrigeration (HVAC&R) system that includes a motor configured to drive a compressor. A variable speed drive (VSD) is coupled to the motor, such that the VSD is configured supply a first electric current to the motor through a plurality of power lines. The HVAC system also includes a plurality of current transducers, where each current transducer of the plurality of current transducers is disposed about a corresponding power line of the plurality of power lines. The HVAC system further includes an adaptive logic board that is communicatively coupled to the VSD, where the adaptive logic board includes a plurality of signal sensing circuits in which each signal sensing circuit of the plurality of signal sensing circuits is electrically coupled to a corresponding current transducer of the plurality of current transducers, such that the plurality of current transducers is configured to generate a plurality of second electric currents. Each signal sensing circuit of the plurality of signal sensing circuits includes a resistor configured to receive a respective second electric current of the plurality of second electric currents and an adaptive sensing unit that is electrically coupled to the resistor, where the adaptive sensing unit is configured to measure a voltage drop of the respective second electric current across the resistor.

BRIEF DESCRIPTION OF THE DRAWINGS

Various aspects of this disclosure may be better understood upon reading the following detailed description and upon reference to the drawings in which.

DETAILED DESCRIPTION

Figure 1:
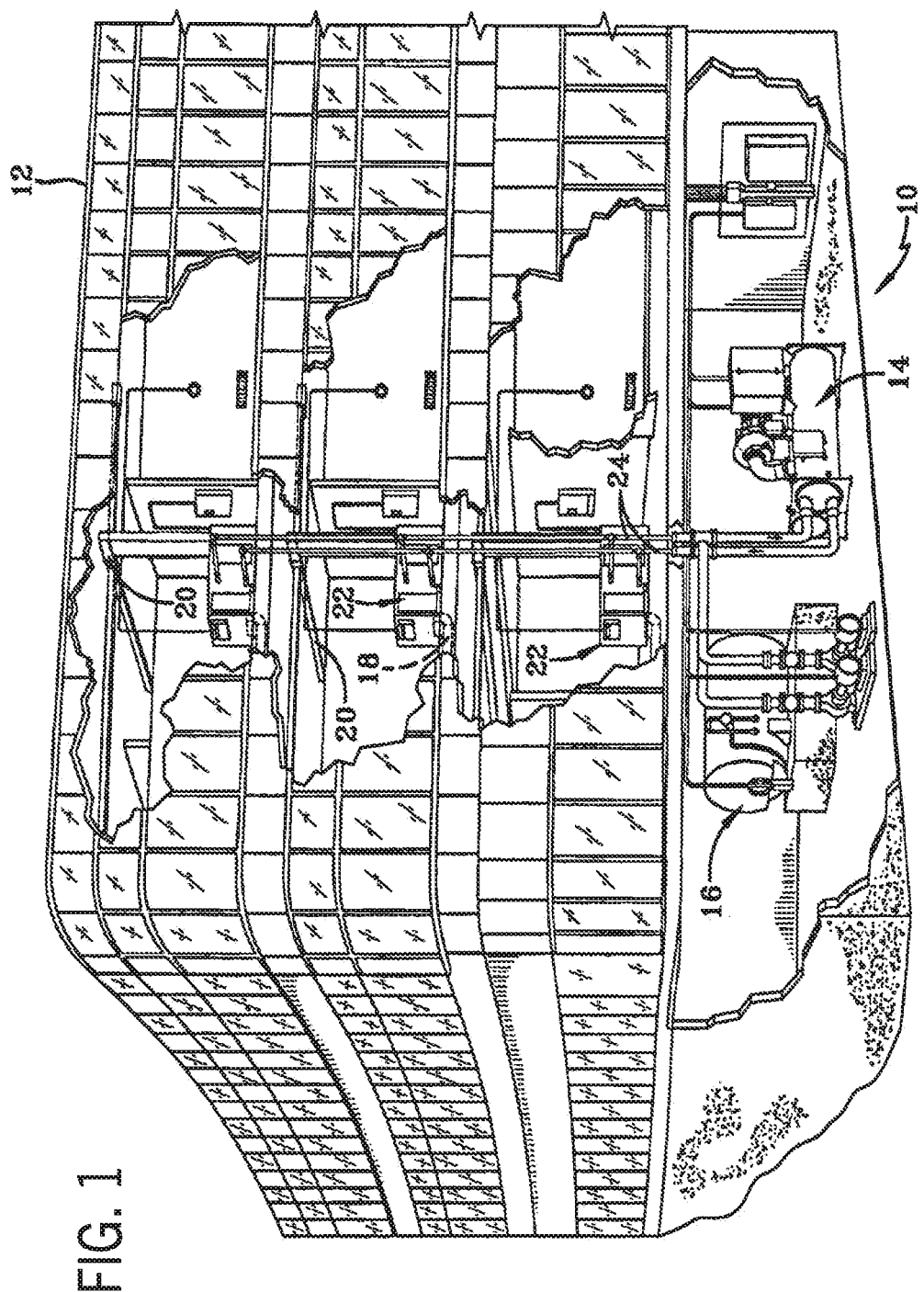
FIG. 1 is a perspective view of an embodiment of a building that may utilize a heating, ventilating, air conditioning, and refrigeration (HVAC&R) system in a commercial setting, in accordance with an aspect of the present disclosure.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

A heating, ventilation, air conditioning, and refrigeration (HVAC&R) system may be used to thermally regulate a space within a building, home, or other suitable structure. For example, the HVAC&R system may include a vapor compression system that transfers thermal energy between a heat transfer fluid, such as a refrigerant, and a fluid to be conditioned, such as air. The vapor compression system may include a condenser and an evaporator that are fluidly coupled to one another via a conduit. A compressor may be used to circulate the refrigerant through the conduit and, thus, enable the transfer of thermal energy between the condenser and the evaporator.

In many cases, the compressor of the HVAC&R system may be driven by a motor. The motor may be communicatively coupled to a control system, including a variable speed drive (VSD). The control system may accelerate the motor from zero revolutions per minute (RPM) to a threshold speed. In some cases, the control system may further regulate a magnitude of the threshold speed during operation of the HVAC&R system. A power output of the motor may be selected based on a capacity (e.g., a cooling demand) of the HVAC&R system. In some cases, a size of the VSD is proportional to the power output of the motor. For example, a relatively large motor may be controlled by a VSD capable of supplying a larger electric current or voltage than a VSD configured to control a relatively small motor. Accordingly, several sizes of the VSD may be included in the HVAC&R system to control a wide range of motors that have varying power output thresholds.

Each VSD may include a printed circuit board (e.g., a logic board), that may monitor and/or control certain operational parameters of the respective VSD. For example, the VSD may monitor a magnitude of electric current drawn by the VSD (e.g., from a power supply), a magnitude of electric current supplied by the VSD (e.g., to the motor), or both. In many cases, a particular logic board may be associated with each size of VSD and may be configured to monitor operating parameters of a particular size of VSD. For example, a logic board configured to monitor operational parameters of a relatively large VSD may include internal components (e.g., such as sensing resistors) rated to operate at a greater load (e.g., a greater current, a higher voltage) than internal components of a logic board configured to monitor operating conditions of a relatively small VSD. Accordingly, several logic boards may be included in the HVAC&R system, each including different internal components and associated with a particular size of VSD. Unfortunately, manufacturing and including multiple different logic boards may complicate assembly and increase production costs of the HVAC&R system.

Embodiments of the present disclosure are directed to an adaptive logic board that may be configured to monitor operational parameters of multiple different sizes of VSDs. For example, the adaptive logic board may determine a size of a given VSD via a harness that communicatively couples the adaptive logic board to the VSD. The harness may transmit a digital or analog identification code from the VSD to the adaptive logic board, which is indicative of a power output rating (e.g., the size) of the VSD. In some cases, the adaptive logic board may include a plurality of internal components (e.g., electronic or electromechanical components), and select a certain combination of internal components corresponding to a particular VSD based off the received identification code. For example, the adaptive logic board may utilize a first set of components when monitoring a relatively large VSD and utilize a second set of components when monitoring a relatively small VSD. In some cases, the adaptive logic board may be configured to monitor 2, 3, 4, 5, 6, or more different sizes of the VSD. As such, the adaptive logic board may reduce assembly costs and facilitate production compared to conventional logic boards.

Turning now to the drawings, FIG. 1 is a perspective view of an embodiment of an environment for a heating, ventilation, air conditioning, and refrigeration (HVAC&R) system 10 in a building 12 for a typical commercial setting. The HVAC&R system 10 may include a vapor compression system 14 (e.g., a chiller) that supplies a chilled liquid, which may be used to cool the building 12. The HVAC&R system 10 may also include a boiler 16 to supply warm liquid to heat the building 12 and an air distribution system which circulates air through the building 12. The air distribution system can also include an air return duct 18, an air supply duct 20, and/or an air handler 22. In some embodiments, the air handler 22 may include a heat exchanger that is connected to the boiler 16 and the vapor compression system 14 by conduits 24. The heat exchanger in the air handler 22 may receive either heated liquid from the boiler 16 or chilled liquid from the vapor compression system 14, depending on the mode of operation of the HVAC&R system 10. The HVAC&R system 10 is shown with a separate air handler on each floor of building 12, but in other embodiments, the HVAC&R system 10 may include air handlers 22 and/or other components that may be shared between or among floors.

Figure 2:
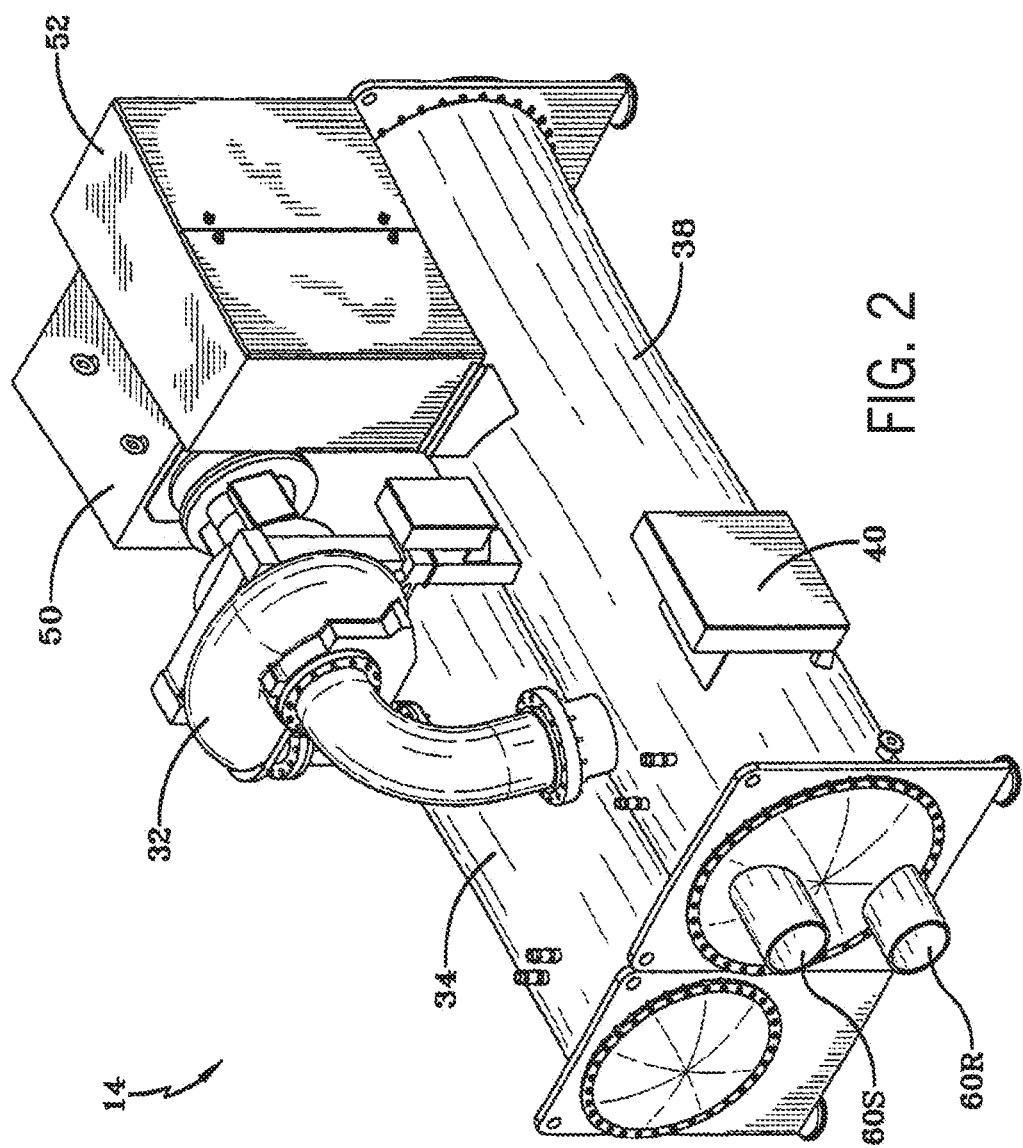
FIG. 2 is a perspective view of a vapor compression system, in accordance with an aspect of the present disclosure.
Figure 3:
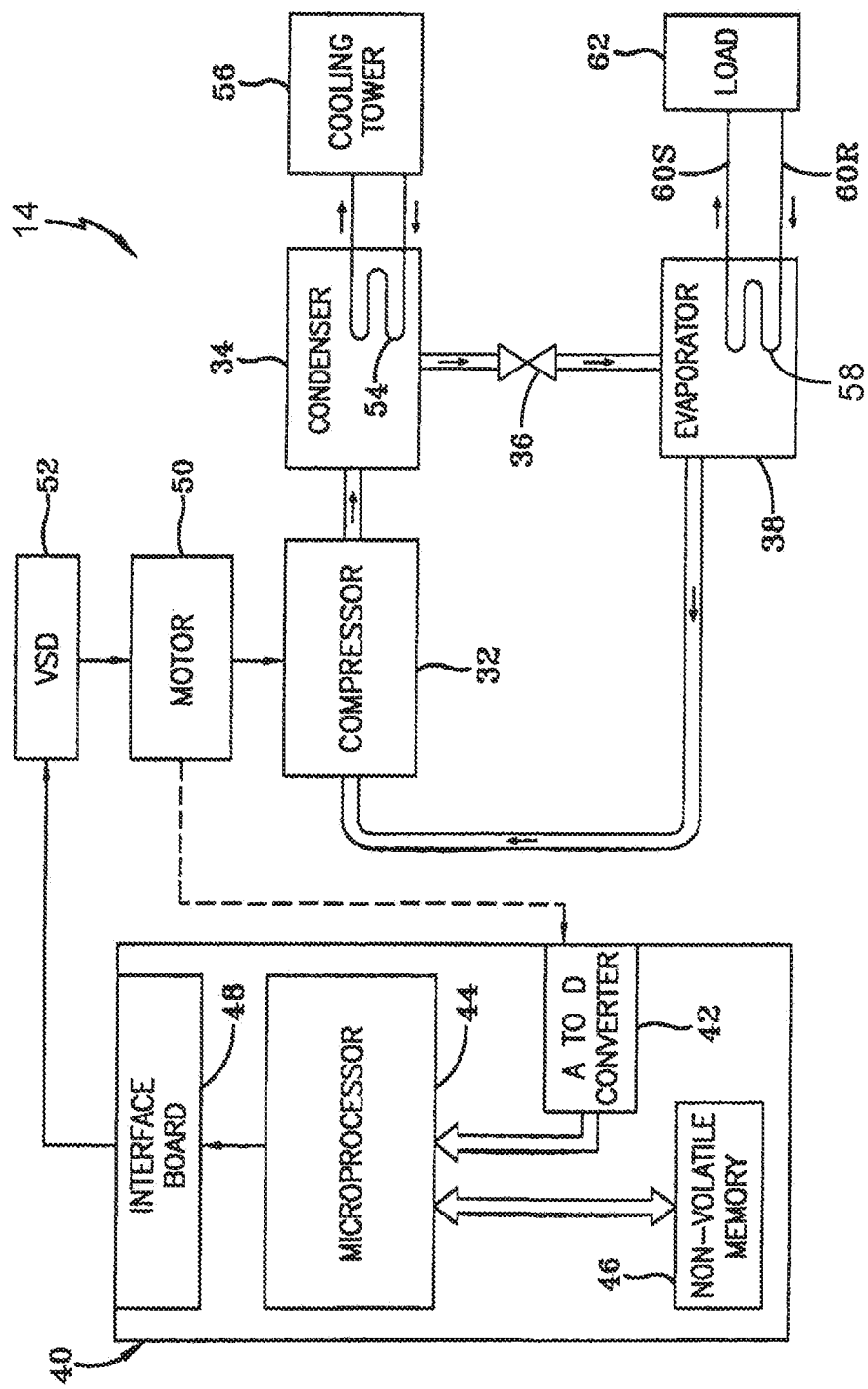
FIG. 3 is a schematic of an embodiment of the vapor compression system of FIG. 2, in accordance with an aspect of the present disclosure.

FIGS. 2 and 3 are embodiments of the vapor compression system 14 that can be used in the HVAC&R system 10. The vapor compression system 14 may circulate a refrigerant through a circuit starting with a compressor 32. The circuit may also include a condenser 34, an expansion valve(s) or device(s) 36, and a liquid chiller or an evaporator 38. The vapor compression system 14 may further include a control panel 40 that has an analog to digital (A/D) converter 42, a microprocessor 44, a non-volatile memory 46, and/or an interface board 48.

Some examples of fluids that may be used as refrigerants in the vapor compression system 14 are hydrofluorocarbon (HFC) based refrigerants, for example, R-410A, R-407, R-134a, hydrofluoro olefin (HFO), "natural" refrigerants like ammonia (NH3), R-717, carbon dioxide ($CO_2$), R-744, or hydrocarbon based refrigerants, water vapor, or any other suitable refrigerant. In some embodiments, the vapor compression system 14 may be configured to efficiently utilize refrigerants having a normal boiling point of about 19 degrees Celsius (66 degrees Fahrenheit) at one atmosphere of pressure, also referred to as low pressure refrigerants, versus a medium pressure refrigerant, such as R-134a. As used herein, "normal boiling point" may refer to a boiling point temperature measured at one atmosphere of pressure.

In some embodiments, the vapor compression system 14 may use one or more of a variable speed drive (VSDs) 52, a motor 50, the compressor 32, the condenser 34, the expansion valve or device 36, and/or the evaporator 38. The motor 50 may drive the compressor 32 and may be powered by a variable speed drive (VSD) 52. The VSD 52 receives alternating current (AC) power having a particular fixed line voltage and fixed line frequency from an AC power source, and provides power having a variable voltage and frequency to the motor 50. In other embodiments, the motor 50 may be powered directly from an AC or direct current (DC) power source. The motor 50 may include any type of motor that can be powered by a VSD or directly from an AC or DC power source, such as a switched reluctance motor, an induction motor, an electronically commutated permanent magnet motor, or another suitable motor.

The compressor 32 compresses a refrigerant vapor and delivers the vapor to the condenser 34 through a discharge passage. In some embodiments, the compressor 32 may be a centrifugal compressor. The refrigerant vapor delivered by the compressor 32 to the condenser 34 may transfer heat to a cooling fluid (e.g., water or air) in the condenser 34. The refrigerant vapor may condense to a refrigerant liquid in the condenser 34 as a result of thermal heat transfer with the cooling fluid. The liquid refrigerant from the condenser 34 may flow through the expansion device 36 to the evaporator 38. In the illustrated embodiment of FIG. 3, the condenser 34 is water cooled and includes a tube bundle 54 connected to a cooling tower 56, which supplies the cooling fluid to the condenser 34.

The liquid refrigerant delivered to the evaporator 38 may absorb heat from another cooling fluid, which may or may not be the same cooling fluid used in the condenser 34. The liquid refrigerant in the evaporator 38 may undergo a phase change from the liquid refrigerant to a refrigerant vapor. As shown in the illustrated embodiment of FIG. 3, the evaporator 38 may include a tube bundle 58 having a supply line 60S and a return line 60R connected to a cooling load 62. The cooling fluid of the evaporator 38 (e.g., water, ethylene glycol, calcium chloride brine, sodium chloride brine, or any other suitable fluid) enters the evaporator 38 via return line 60R and exits the evaporator 38 via supply line 60S. The evaporator 38 may reduce the temperature of the cooling fluid in the tube bundle 58 via thermal heat transfer with the refrigerant. The tube bundle 58 in the evaporator 38 can include a plurality of tubes and/or a plurality of tube bundles. In any case, the vapor refrigerant exits the evaporator 38 and returns to the compressor 32 by a suction line to complete the cycle.

Figure 4:
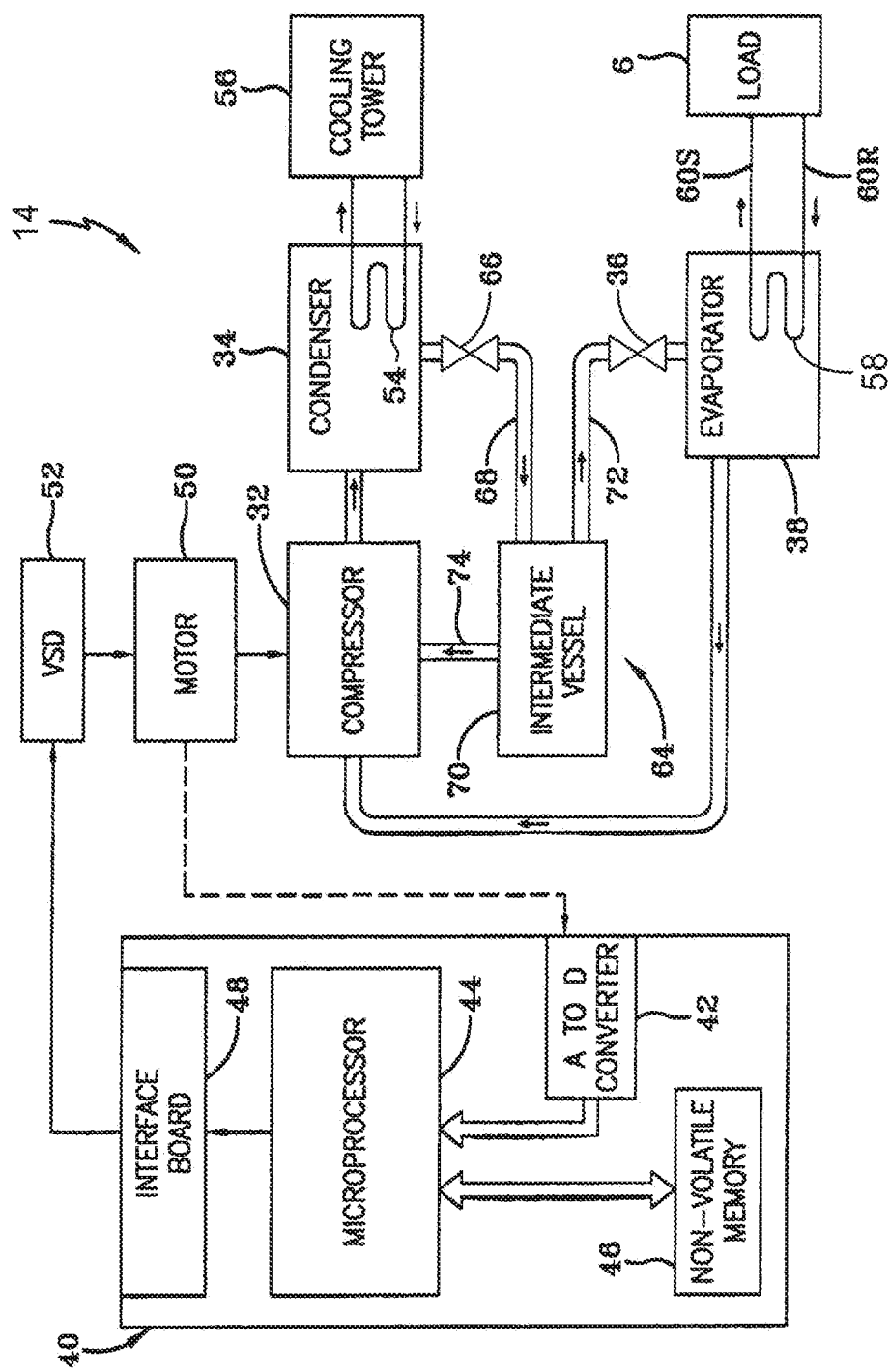
FIG. 4 is a schematic of an embodiment of the vapor compression system of FIG. 2, in accordance with an aspect of the present disclosure.

FIG. 4 is a schematic of the vapor compression system 14 with an intermediate circuit 64 incorporated between condenser 34 and the expansion device 36. The intermediate circuit 64 may have an inlet line 68 that is directly fluidly connected to the condenser 34. In other embodiments, the inlet line 68 may be indirectly fluidly coupled to the condenser 34. As shown in the illustrated embodiment of FIG. 4, the inlet line 68 includes a first expansion device 66 positioned upstream of an intermediate vessel 70. In some embodiments, the intermediate vessel 70 may be a flash tank (e.g., a flash intercooler). In other embodiments, the intermediate vessel 70 may be configured as a heat exchanger or a "surface economizer." In the illustrated embodiment of FIG. 4, the intermediate vessel 70 is used as a flash tank, and the first expansion device 66 is configured to lower the pressure of (e.g., expand) the liquid refrigerant received from the condenser 34. During the expansion process, a portion of the liquid may vaporize, and thus, the intermediate vessel 70 may be used to separate the vapor from the liquid received from the first expansion device 66.

Additionally, the intermediate vessel 70 may provide for further expansion of the liquid refrigerant because of a pressure drop experienced by the liquid refrigerant when entering the intermediate vessel 70 (e.g., due to a rapid increase in volume experienced when entering the intermediate vessel 70). The vapor in the intermediate vessel 70 may be drawn by the compressor 32 through a suction line 74 of the compressor 32. In other embodiments, the vapor in the intermediate vessel may be drawn to an intermediate stage of the compressor 32 (e.g., not the suction stage). The liquid that collects in the intermediate vessel 70 may be at a lower enthalpy than the liquid refrigerant exiting the condenser 34 because of the expansion in the expansion device 66 and/or the intermediate vessel 70. The liquid from intermediate vessel 70 may then flow in line 72 through a second expansion device 36 to the evaporator 38.

It should be appreciated that any of the features described herein may be incorporated with the vapor compression system 14, or any other suitable HVAC&R systems. As discussed above, embodiments of the present disclosure are directed to an adaptive logic board that may be configured to control various sizes of the VSD 52. The size of the VSD 52 may be indicative of a magnitude of a power output range (e.g., supply current, supply voltage) the VSD 52 is configured to generate. For example, a larger VSD may be used to control operation of a relatively large motor (e.g., a 5,000 horsepower (HP) motor). Conversely, a smaller VSD may be used to operate a relatively small motor (e.g., a 100 HP motor). In some embodiments, the adaptive logic board may monitor and/or control operational parameters of the VSD 52 using certain electrical components (e.g., resistors, transistors, current transducers) that are electrically coupled to the adaptive logic board. For example, the adaptive logic board may monitor an output current generated by the VSD 52 through a series of current transducers and resistors, and instruct the VSD 52 to increase or decrease the output current when the output current deviates from a predetermined value.

In many cases, certain electrical components are selected to monitor operational parameters associated with a particular size (e.g., power output rating) of VSD. For example, a relatively large VSD may output an electrical current that is substantially larger in magnitude than an electrical current output by a relatively small VSD. In such cases, a first set of electrical components may monitor the output current of the relatively large VSD, while a second set of electrical components may monitor operating parameters of the relatively small VSD. In some embodiments, certain components of the first set may be included in the second set, and vice versa.

As discussed in greater detail herein, an adaptive logic board may include multiple sets of electrical components, in which each set of electrical components may be configured to monitor voltages and/or currents that are within a predetermined threshold range. The adaptive logic board may select a particular set of the electrical components with which to monitor the VSD 52, based on the size of the VSD 52. Accordingly, the adaptive logic board may control multiple different sizes of VSDs, each of which may output electrical currents and/or voltages that are within a particular threshold range. As such, a single adaptive logic board may be included in the vapor compression system 14 to monitor a relatively small VSD, a relatively middle-sized VSD, or a relatively large VSD.

Figure 5:
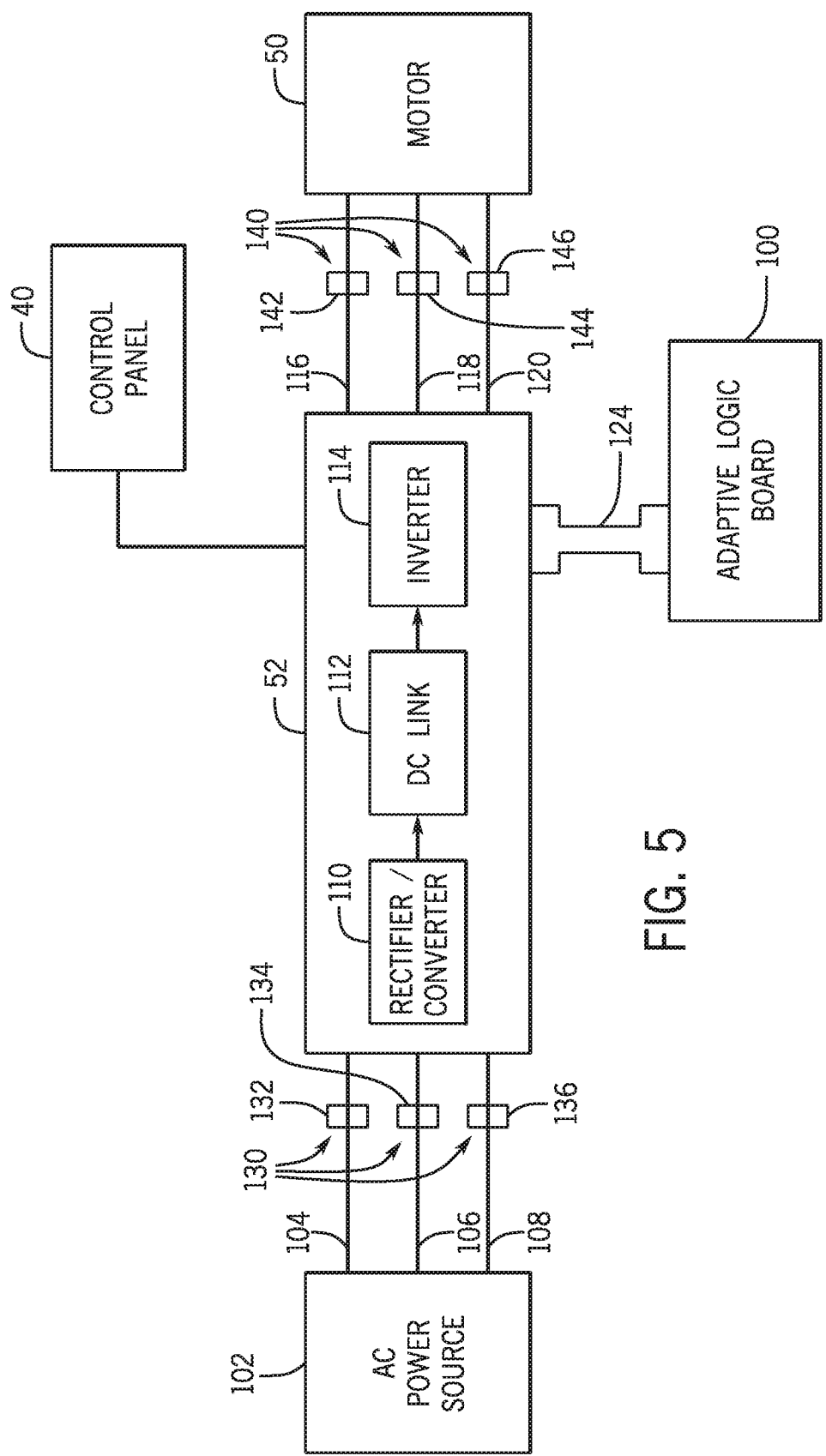
FIG. 5 is a schematic of an embodiment of a general configuration of a variable speed drive (VSD) that may be used in the vapor compression system in FIGS. 2-4, in accordance with an aspect of the present disclosure.

With the foregoing in mind, FIG. 5 is a schematic diagram of an embodiment of the VSD 52 including an adaptive logic board 100, which may be used to control the motor 50 of the vapor compression system 14 of FIGS. 1-4. As discussed above, an alternating current (AC) power source 102 may supply AC power to the VSD 52, which in turn, supplies AC power to the motor 50. The AC power source 102 may provide three-phase, fixed voltage, and fixed frequency AC power to the VSD 52 from an AC power grid or distribution system that is present near the system. For example, the AC power source 102 may provide a first phase of AC power, a second phase of AC power, and a third phase of AC power through a first receiving line 104, a second receiving line 106, and a third receiving line 108, respectively.

The AC power may be supplied directly from an electric utility or from one or more transforming substations between the electric utility and the AC power grid. In some embodiments, the AC power source 102 may supply a three phase AC voltage, or line voltage, of up to 15 kilovolts (kV) at a line frequency of between 50 Hertz (Hz) and 60 Hz to the VSD 52, depending on the corresponding AC power grid. However, in other embodiments, the AC power source 102 can provide any suitable fixed line voltage or fixed line frequency to the VSD 52 depending on the configuration of the AC power grid. In addition, a particular site can have multiple AC power grids that can satisfy different line voltage and line frequency demands.

The VSD 52 provides AC power from the AC power source 102 to the motor 50 at a desired voltage and desired frequency, both of which can be varied to satisfy predetermined set points of the motor 50. In certain embodiments, the VSD 52 may provide AC power to the motor 50 having higher voltages and frequencies or lower voltages and frequencies than the fixed voltage and fixed frequency received from the AC power source 102. For example, the VSD 52 may have three internal stages: a converter 110 (e.g., a rectifier), a direct current (DC) link 112, and an inverter 114. The converter 110 may convert the fixed line frequency and/or the fixed line voltage from the AC power source 102 into DC power. The DC link 112 may filter the DC power from the converter 110 and/or store energy utilizing components such as capacitors and/or inductors (not shown). The inverter 114 may convert the DC power from the DC link 112 back into variable frequency, variable voltage AC power (e.g., three phase AC power) for the motor 50. For example, the inverter 114 may supply the motor 50 with a first phase of AC power, a second phase of AC power, and a third phase of AC power through a first output line 116, and second output line 118, and a third output line 120, respectively.

In some embodiments, the converter 110 may be a pulse width modulated (PWM) boost converter or rectifier having insulated gate bipolar transistors (IGBTs) to provide a boosted DC voltage to the DC link 112 and produce a fundamental root mean square (RMS) output voltage from the VSD 52 that is greater than a fixed nominal fundamental RMS input voltage to the VSD 52. In certain embodiments, the VSD 52 may provide an output voltage at a frequency that is greater than or lower than a fixed frequency of the input voltage provided to the VSD 52. Furthermore, in some embodiments, the VSD 52 may incorporate additional components from those shown in FIG. 5 to provide the motor 50 with appropriate output voltages and frequencies.

In certain embodiments, the motor 50 may be an induction motor that is capable of being driven at variable speeds. The induction motor can have any suitable pole arrangement including two poles, four poles, six poles, or any suitable number of poles. The induction motor is used to drive a load, such as the compressor 32 of the vapor compression system 14. In other embodiments, the motor 50 may be any suitable motor to drive the compressor 32.

In some embodiments, the adaptive logic board 100 may be communicatively coupled to the VSD 52 via a harness 124 or, as discussed below, via a plurality of harnesses. The harness 124 may include a plurality of wires (e.g., copper wires, optical fibers), which enable the transmission of data and/or signals between the VSD 52 and the adaptive logic board 100. In some embodiments, the harness 124 may enable the VSD 52 to send an identification code (e.g., a digital code, an analog signal) to the adaptive logic board 100, which may be indicative of a size (e.g., a power output rating) of the VSD 52. The identification code may be stored within a memory device of the VSD 52, which may include volatile memory, such as random access memory (RAM), and/or a nonvolatile memory, such as read-only memory (ROM). Additionally or otherwise, the identification code may be stored on the non-volatile memory 46 of the control panel 40, or, within the harness 124 itself, (e.g., via an additional memory device).

Multiple predetermined identification codes may be generated (e.g., during manufacturing of the VSD 52) that each correspond to a particular size of the VSD 52. In other words, a VSD configured to operate motors within a first threshold horsepower range may be associated with a first identification code, while a VSD configured to motors within a second threshold horsepower range may be associated with a second identification code. In some embodiments, the adaptive logic board 100 is configured to receive 2, 3, 4, 5, 6, or more identification codes, each corresponding to a particular size of the VSD 52. In any case, the harness 124 may enable the adaptive logic board 100 to determine the size of the VSD 52, by transmitting the identification code between the VSD 52 and the adaptive logic board 100.

In some embodiments, the adaptive logic board 100 may determine the size of the VSD 52 based off a structure of the harness 124. For example, a particular harness may be associated with each size, or a range of sizes, of the VSD 52. The harness 124 may include additional or fewer connection wires depending on the size of the associated VSD 52. For example, a harness associated with a relatively large VSD may include a first quantity of connection wires (e.g., a large quantity of connection wires), while a harness associated with a relatively small VSD may include a second quantity of connection wires (e.g., a small quantity of connection wires). In some embodiments, the harness 124 may electrically couple to the adaptive logic board 100 via a universal plug (e.g., a terminal plug). The universal plug may include a predetermined amount of connections ports, of which a first quantity of the connection ports are electrically coupled to the connection wires. Accordingly, in some embodiments, a second quantity (e.g., a remaining quantity) of the connection ports may remain vacant. The adaptive logic board 100 may determine a quantity of connection wires included in the universal plug, and a quantity of vacant connection ports and, thus, determine a size of the VSD 52.

For example, the adaptive logic board 100 may send a test signal to each connection port of the plurality of connection ports, and determine whether a particular connection port communicatively couples the adaptive logic board 100 to the VSD 52. Accordingly, the adaptive logic board 100 may determine a number of established connection ports and a number of connection ports that are left vacant. The adaptive logic board 100 may use the number of established connection ports and the number of vacant connection ports to determine the size of the VSD 52. As a non-limiting example, three vacant positions may indicate that the adaptive logic board 100 is coupled to a relatively small VSD, while no vacant positions may indicate that the adaptive logic board 100 is coupled to a relatively large VSD.

As noted above, in some embodiments, multiple harnesses may be used to electrically couple the adaptive logic board 100 to the VSD 52. For example, the adaptive logic board 100 may include respective harnesses that are associated with various communication, voltage sensing, and/or current sensing features of the adaptive logic board 100. In some embodiments, the adaptive logic board 100 may be configured to determine a size of the VSD 52 based on these additional harnesses in addition to, or in lieu of, the harness 124. That is, in some embodiments, the adaptive logic board 100 may determine a size of the VSD 52 based on a structure of and/or communications from any one harness or combination of harnesses that may be used to electrically couple the adaptive logic board 100 to the VSD 52. As such, in accordance with the techniques discussed above, the adaptive logic board 100 may determine a size of the VSD 52 by identifying, for example, a number of established connection ports in the additional harnesses and the number of vacant connection ports in the additional harnesses. Additionally or alternatively, the adaptive logic board 100 may determine the size of the VSD based on an identification code that may be stored within one or more of the harnesses (e.g., through respective memory devices disposed within the harnesses).

It should be noted that, in certain embodiments, the adaptive logic board 100 may include an input device 128, such as a user selectable switch, which may enable an operator to manually specify a size of the VSD 52 during installation of the adaptive logic board 100 on the VSD 52. As an example, in some embodiments, the input device 128 may include a switch that may transition between three switch positions, where the switch positions are respectively associated with, for example, a relatively small VSD, a relatively mid-sized VSD, or a relatively large VSD. Accordingly, when coupling the VSD to, for example, a relatively large VSD, the operator may transition the input device 128 to the switching position associated with the relatively large VSD, such that the adaptive logic board 100 may select a particular set of electrical components with which to monitor the VSD 52. That is, in the present example, the adaptive logic board 100 may select electrical components that are suitable to monitor parameters of the relatively large VSD.

Indeed, as described in greater detail herein, the adaptive logic board 100 may include multiple sets of internal electrical components that are each configured to monitor operational parameters of a particular size of the VSD 52. For example, the adaptive logic board 100 may include electrical components that are suitable to monitor operating parameters of a relatively small VSD, and additional internal electrical components that are suitable to monitor operating parameters of a relatively large VSD. The adaptive logic board 100 may use the identification code received from the VSD 52, or the structure of the harness 124, to select electrical components suitable for monitoring the particular VSD 52 to which the adaptive logic board 100 is coupled.

In some embodiments, the adaptive logic board 100 may monitor a magnitude of an electric current drawn by the VSD 52 from the AC power source 102. For example, the adaptive logic board 100 may be communicatively coupled (e.g., via the harness 124) to input current transducers 130, which may be disposed on the first receiving line 104, the second receiving line 106, and/or the third receiving line 108. The input current transducers 130 may be used to monitor the flow of electric current through a power wire (e.g., the first, second, or third receiving lines 104, 106, 108) and generate an output signal (e.g., an electric current) that is proportional to, but less than, the flow of electric current through the respective power wire.

For example, a first input current transducer 132 disposed on the first receiving line 104 may monitor the first phase of AC power flowing through the first receiving line 104. Accordingly, the first input current transducer 132 may output an electric current (e.g., a signal) that is proportional to the magnitude of the first phase of AC power. For example, an amperage of the electric current flowing through the first receiving line 104 may be between 100 amperes (amps) and 2000 amps, while an amperage of the output signal generated by the first input current transducer 132 may be between 1 milliampere (mA) and 2 amps. Similarly, a second input current transducer 134 disposed on the second receiving line 106 may monitor the second phase of AC power flowing through the second receiving line 106, while a third input current transducer 136 disposed on the third receiving line 108 may monitor the third phase of AC power flowing through the third receiving line 108.

The adaptive logic board may additionally monitor a magnitude of the electric current the VSD 52 supplies to the motor 50. For example, output current transducers 140 may include a first output current transducer 142, a second output current transducer 144, and a third output current transducer 146 disposed on the first output line 116, the second output line 118, and the third output line 120, respectively. Accordingly, the first, second, and third output current transducers 142, 144, and 146 may monitor the first, second, and third phase of AC power flowing through the first, second, and third output lines 116, 118, and 120, respectively. Similarly to the input current transducers 130, the output current transducers 140 may each communicatively couple to the adaptive logic board 100 via the harness 124.

Figure 6:
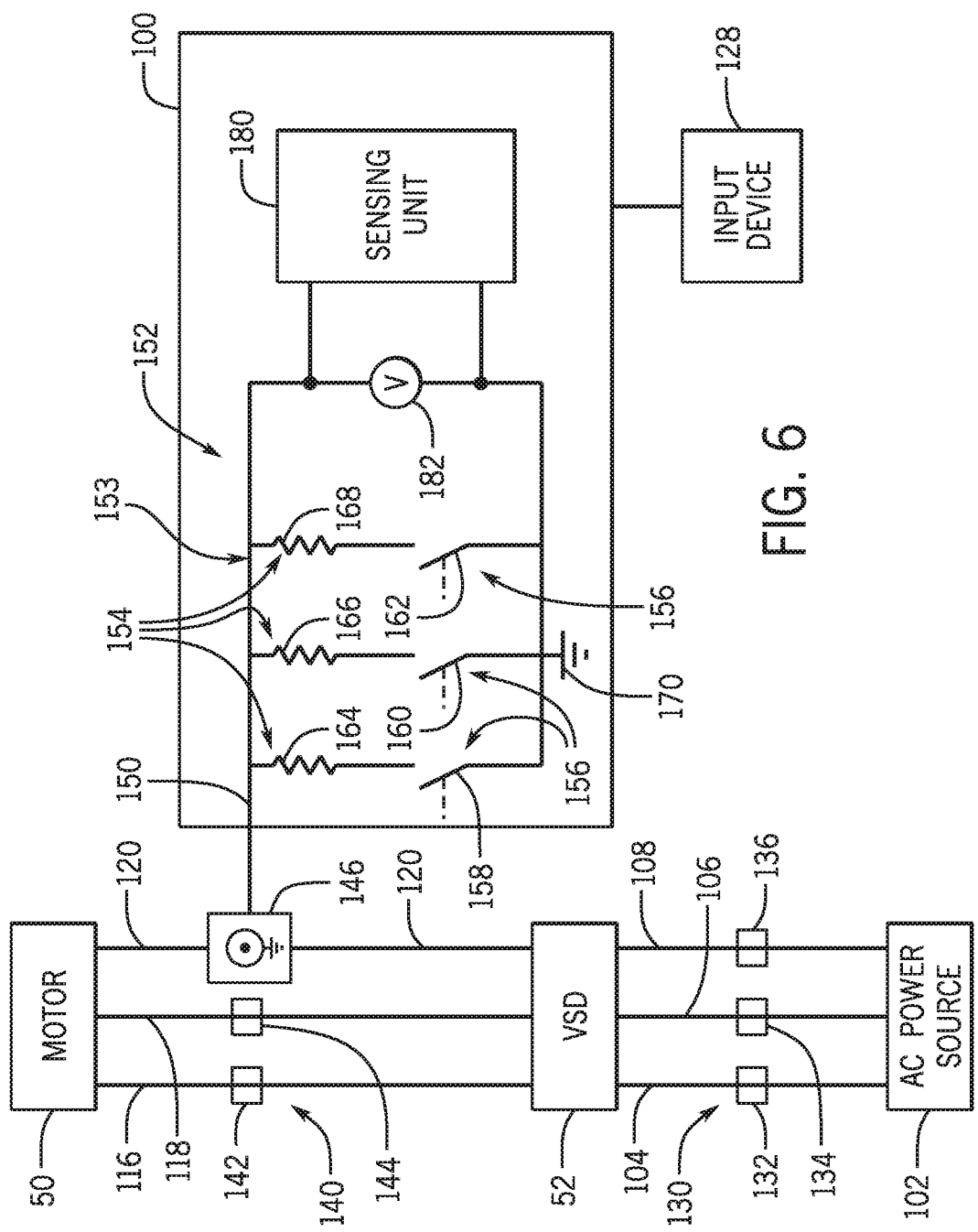
FIG. 6 is a schematic of an embodiment of a general configuration of an adaptive logic board that may be used in a VSD, in accordance with an aspect of the present disclosure.

FIG. 6 is a schematic diagram of an embodiment of the adaptive logic board 100. The adaptive logic board 100 may include one or more signal sensing circuits 152, which may be used to analyze the output signals generated by each of the input current transducers 130 and each of the output current transducers 140. It should be noted that the illustrated embodiment of FIG. 6 shows a single signal sensing circuit 153 of the one or more signal sensing circuits 152, which is associated with, and configured to analyze, the output signal generated by the third output current transducer 146. However, the adaptive logic board 100 may include an individual signal sensing circuit associated with each of the input current transducers 130 and each of the output current transducers 140, to monitor a respective output signal of each of the input and output current transducers 130 and 140. Accordingly, in some embodiments, the adaptive logic board 100 may include six signal sensing circuits 152, in which each of the six signal sensing circuits 152 is associated with, and communicatively coupled to, one of the input current transducers 130 or one of the output current transducers 140. Additionally or otherwise, the adaptive logic board 100 may include additional or fewer than six signal sensing circuits 152. For example, certain embodiments of the adaptive logic board 100 may include 1, 2, 3, 4, 5, 6, or more signal sensing circuits 152.

The signal sensing circuit 153 may include one or more resistors 154, which are each electrically coupled to a signal line 150 of the signal sensing circuit 153 in a parallel arrangement. The signal line 150 may extend between the third current transducer 146 and the signal sensing circuit 153 and, thus, transmit the output signal generated by the third output current transducer 146 to the signal sensing circuit 153. One or more switches 156 may be disposed between each of the one or more resistors 154 and the signal line 150, such that the adaptive logic board 100 may electrically couple, or electrically decouple, certain resistors from the signal sensing circuit 153. As described in greater detail herein, in some embodiments, each of the one or more switches 156 may include a Metal-Oxide Semiconductor Field-Effect Transistor (MOSFET). However, in other embodiments, the one or more switches may include any other suitable current regulation and/or voltage regulation component.

The one or more switches 156 may include a first switch 158, a second switch 160, and a third switch 162, which may be associated with a first resistor 164, a second resistor 166, and a third resistor 168 of the one or more resistors 154, respectively. Each of the one or more switches 156 may move between a closed circuit position and an open circuit position, and thus, electrically couple or electrically decouple a respective resistor from the signal sensing circuit 153. For example, the adaptive logic board 100 may instruct the first switch 158 to move to the closed circuit position, while the second and third switches 160, 162 move to the open circuit position. As such, electrical current from the signal line 150 may flow through the first resistor 164 to a ground terminal 170, while substantially no electrical current flows through the second and third resistors 166 and 168.

In some embodiments, each of the one or more resistors 154 may have a different nominal resistance value. For example, the first resistor 164 of the one or more resistors 154 may have a relatively small resistance value (e.g., 0.1 Ohms to 5 Ohms), while the second resistor 166 has a relatively mid-range resistance value (e.g., 5 Ohms to 8 Ohms), and the third resistor 168 has a relatively large resistance value (e.g., 8 Ohms to 100 Ohms, or more than 100 Ohms). Accordingly, the first resistor 164, the second resistor 166, and the third resistor 168 may each be configured to operate over a predetermined operating range of electrical currents. For example, if a magnitude of the electrical current supplied to the first resistor 164 is below a threshold value (e.g., a first threshold value determined by a combination of a resistor and an electrical current), the first resistor 164 may not provide a sufficient output voltage and reduce an accuracy of operation.

As discussed above, a size of the VSD 52, and thus, a magnitude of the current flowing through the third output line 120, may determine a magnitude the current generated by the third output current transducer 146. Accordingly, the size of the VSD 52 may determine the magnitude of the output current supplied to the signal sensing circuit 153 via the signal line 150. The adaptive logic board 100 may recognize the size of the VSD 52 (e.g., via the identification code) and select which resistor of the one or more resistors 154 that corresponds to the range of output signals generated by the third output current transducer 146 for the particular VSD.

For example, if the identification code indicates that a size of the VSD 52 is relatively large, the adaptive logic board 100 may instruct the switches 156 to electrically decouple the first resistor 164 (e.g., a relatively low-resistance resistor) and the second resistor 166 (a relatively mid-range resistance resistor) from the signal sensing circuit 153, while electrically coupling the third resistor 168 (e.g., the relatively high-resistance resistor) to the signal line 150. Accordingly, the output signal (e.g., the electrical current) generated by the third output current transducer 146 may flow through the signal line 150, the third resistor 168 of the signal sensing circuit 153, and the ground terminal 170. Conversely, if the identification code received by the adaptive logic board 100 indicates that a size of the VSD 52 is relatively small, the adaptive logic board 100 may instruct the switches 156 to electrically couple the first resistor 164 to the signal line 150, while electrically decoupling the second resistor 166 and the third resistor 168 from the signal line 150. Moreover, in some embodiments, the adaptive logic board 100 may be configured to electrically couple a combination of the resistors 154 to the signal sensing circuit 153, such that, for a particular VSD, a cumulative resistance of the combination of the resistors 154 is suitable to receive an expected range of output signals (e.g., output current) generated by the third output current transducer 146 for that particular VSD. As an example, if the identification code received by the adaptive logic board 100 indicates that the VSD 52 is a relatively mid-sized VSD, the adaptive logic board 100 may electrically couple the first resistor 164 and the second resistor 166 to the signal line 150, while electrically decoupling the third resistor 168 from the signal line 150.

Although three resistors are shown in the illustrated embodiment of FIG. 6, it should be noted that the signal sensing circuit 153 may include any number of resistors, such as 2, 3, 4, 5, 6, 7, 8, 9, 10, or more resistors, which are each associated with a corresponding switch of the one or more switches 156. Accordingly, the adaptive logic board 100 may select any suitable resistor from the group of 2, 3, 4, 5, 6, 7, 8, 9, 10, or more resistors, depending on a size of the VSD 52, and electrically couple the selected resistor to the signal sensing circuit 153. For example, the adaptive logic board 100 may electrically couple a first size (e.g., a first resistivity) of resistor to the signal sensing circuit 153 when the adaptive logic board detects a first size of VSD, electrically couple a second size (e.g., a second resistivity) of resistor to the signal sensing circuit when detecting a second size of VSD, and so on. The resistor of the one or more resistors 154 that is electrically coupled to the signal sensing circuit 153 will be referred to herein as an "active resistor." In other words, the active resistor may correspond to a resistor of the one or more resistors 154 that is associated with a particular size of VSD, and is electrically coupled to the signal sensing circuit 153 when the adaptive logic board 100 is communicatively coupled to that particular size of VSD.

In certain embodiments, the one or more switches 156 may electrically couple the active resistor to the signal sensing circuit 153 permanently. For example, when the adaptive logic board 100 is communicatively coupled to the VSD 52 via the harness 124, the adaptive logic board 100 may determine the size of the VSD 52, and thus, configure the signal sensing circuit 153 to correspond to that size of the VSD 52 by selecting an appropriate active resistor from the one or more resistors 154. In some embodiments, the active resistor may remain electrically coupled to the signal sensing circuit 153 even when the adaptive logic board 100 is communicatively decoupled (e.g., such as for maintenance) from the VSD 52. In other embodiments, the adaptive logic board 100 may be configured to "reset," and select an appropriate active resistor each time the adaptive logic board 100 is decoupled from a first VSD, and recoupled to a second VSD. For example, the adaptive logic board 100 may select the first resistor 164 as the active resistor when the adaptive logic board 100 is communicatively coupled to a first size of VSD. If the adaptive logic board is decoupled from the first size of VSD, and subsequently recoupled to a second size of VSD, the adaptive logic board may automatically select a different resistor from the plurality of resistors 154 as the active resistor (e.g., such as one of the second or third resistors 166, 168).

In some embodiments, the adaptive logic board 100 may evaluate the output signal generated by the third output current transducer 146 via a sensing unit 180. For example, the sensing unit 180 may be electrically coupled to a voltage meter 182, or other suitable sensing instrument, which measures a voltage drop across the active resistor of the signal sensing circuit 153. A magnitude of the voltage drop across the active resistor may be indicative of a magnitude of the output signal generated by third output current transducer 146, and thus, a magnitude of the current flowing through the third output line 120. In certain embodiments, the adaptive logic board 100 may instruct the VSD 52 to electrically couple a different resistor of the one or more resistors 154 to the signal line 150 when the measured voltage drop across the active resistor deviates from a target value by a predetermined amount. For example, in embodiments where the active resistor is the second resistor 166 (e.g., a resistor having a mid-range resistance value) and the measured voltage drop across the active resistor is below the target value by the predetermined amount, the adaptive logical board 100 may electrically decouple (e.g., via the second switch 160) the second resistor 166 from the signal line 150, and electrically couple (e.g., via the first switch 158) the first resistor 164 (e.g., a resistor having a relatively low resistance value) to the signal line 150. Accordingly, the adaptive logical board 100 may improve a measurement resolution of the sensing unit 180 by changing a resistance of the signal sensing circuit 153, such that a magnitude of the voltage drop across the active resistor does not fall below an effective operating range of the sensing unit 180. In some embodiments, if the measured voltage drop across the active resistor is below the target value by the predetermined amount, and the active resistor includes the smallest resistance value among the other resistors 154, the adaptive logic board 100 may instruct the VSD 52 to interrupt electric current output to the motor 50. As discussed above, the adaptive logic board 100 may include an individual signal sensing circuit associated with each of the input current transducers 130 and each of the output current transducers 140, thereby enabling the adaptive logic board 100 to monitor each phase of AC power flowing through the VSD 52.

Figure 7:
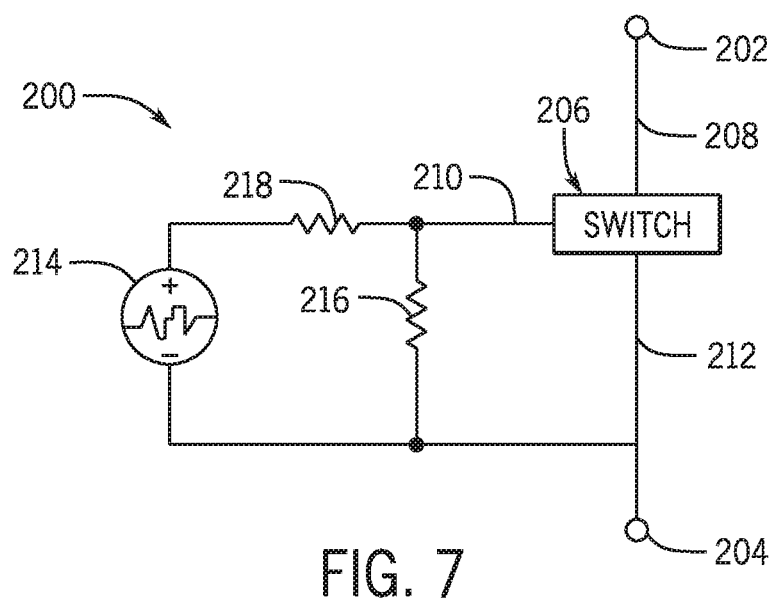
FIG. 7 is a schematic diagram of an embodiment of a switch that may be used in the adaptive logic board, in accordance with an embodiment of the present disclosure.

FIG. 7 is a schematic diagram of an embodiment of a switch 200, which may be representative of each of the one or more switches 156. For example, each of the first, second, or third switches 158, 160, and 162 may include the switch 200. The switch 200 may include an upper node 202 and a lower node 204, which may electrically couple to one of the one or more resistors 154 (e.g., the first, second, or third resistors 164, 166, and 168) and the ground terminal 170, respectively. The switch 200 may include an electrical switching element 206, such as a Metal-Oxide Semiconductor Field-Effect Transistor (MOSFET), an integrated circuit controller, or another suitable switching element. In some embodiments, the switching element may include a drain 208, a gate 210, and a source 212 that enable the switching element 206 to transition between a closed circuit position and an open circuit position. Particularly, the switching element 206 may be operable to create an open circuit or a short circuit between the upper node 202 and the lower node 204, which may enable or disable, the flow of electric current between the upper and lower nodes 202, 204.

In some embodiments, the switching element 206 may enable the voltage drop between the upper node 202 and the lower node 204 of the switch 200 to be substantially zero while the switching element 206 is in the closed circuit positon. Accordingly, the switch 200 may not substantially affect the voltage drop across the active resistor, and thus, enhance the accuracy of the voltage drop as measured by the sensing unit 180. In certain embodiments, the switching element 206 may be controlled using a voltage source 214, which may generate a voltage differential between the gate 210 and a ground (e.g., the ground terminal 170), such that the switching element 206 is adjusted between the open and closed circuit positons. In some embodiments, resistors 216 and 218 may be used to reduce or substantially mitigate electrical stress (e.g., electrical impulses) that may be applied to the switching element 206 during operation of the adaptive logic board 100. As such, the resistors 216 and 218 may also prevent or restrict the switching element 206 from inadvertently transitioning between the closed and open circuit positions. It should be appreciated that the resistors 216 and 218 may each have a same nominal resistance value or a different nominal resistance value.

Figure 8:
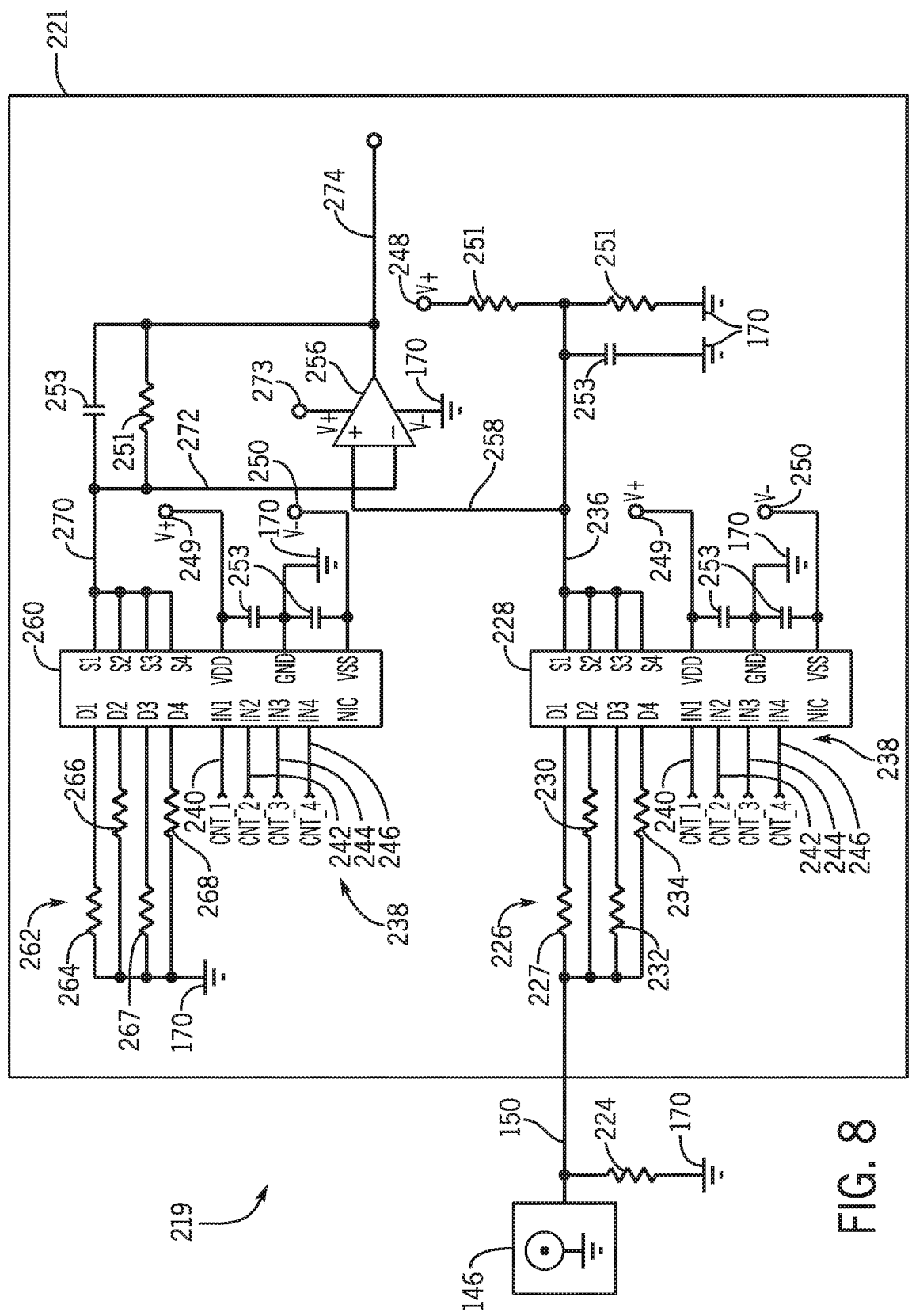
FIG. 8 is a schematic of an embodiment of a general configuration of a signal sensing circuit that may be included in the adaptive logic board, in accordance with an aspect of the present disclosure.

FIG. 8 is schematic diagram of another embodiment of a signal sensing circuit that may be included in the one or more signal sensing circuits 152 of the adaptive logic board 100. In particular, the illustrated embodiment shows a signal sensing circuit 219 that includes an adaptive sensing unit 221, instead of the signal sensing unit 180, which may be used to monitor current flow through the output line 150. In the illustrated embodiment of FIG. 8, the signal sensing circuit 219 does not include multiple resistors (e.g., such as the resistors 164, 166, 168) that are configured to be electrically coupled to or electrically decoupled (e.g., via the switches 156) from the signal sensing circuit 219 based on a detected size of the VSD 52. Instead, the signal sensing circuit 219 may include a single resistor, such as a resistor 224, which is electrically coupled to the signal line 150 and the ground terminal 170. Indeed, the adaptive sensing unit 221 may include electrical components that are adjustable based on the detected size of the VSD 52, thereby enabling the adaptive sensing unit 221 to suitably monitor a voltage drop across the resistor 224 for various sizes of VSDs. That is, the adaptive sensing unit 221 may include a configurable gain, thereby enabling the adaptive sensing unit 221 to effectively monitor an expected voltage drop that may be generated across the resistor 224 by a current output of the third output current transducer 146 for a particular size of VSD. In other words, the adaptive sensing unit 221 may select particular electrical components with which to effectively monitor the voltage drop across the resistor 224.

As discussed above with respect to the signal sensing circuit 153, it should be appreciated that the adaptive logic board 100 may include multiple signal sensing circuits 219 that are each configured to analyze the output signals generated by a corresponding one of the input current transducers 130 and a corresponding one of the output current transducers 140. That is, in some embodiments, the adaptive logic board 100 may include six signal sensing circuits 152, in which each of the six signal sensing circuits 152 is associated with, and communicatively coupled to, one of the input current transducers 130 or one of the output current transducers 140. As an example, the illustrated embodiment of FIG. 8 shows the single signal sensing circuit 219 that is associated with, and configured to analyze, the output signal generated by the third output current transducer 146.

As shown in the illustrated embodiment, the third output current transducer 146 is electrically coupled to the resistor 224 and the adaptive sensing unit 221 via the signal line 150. Particularly, the signal line 150 is electrically coupled to a first plurality of resistors 226 of the adaptive sensing unit 221, which are each electrically coupled to a first integrated circuit controller 228. In some embodiments, the first plurality of resistors 226 includes a first resistor 227, a second resistor 230, a third resistor 232, and a fourth resistor 234. The first integrated circuit controller 228 includes internal components (e.g., transistors, diodes, resistors, capacitors, etc.) that enable the first integrated circuit controller 228 to electrically couple or electrically decouple a particular resistor of the first plurality of resistors 226 to an output line 236 of the adaptive sensing unit 221. The adaptive logic board 100 (e.g., a controller of the adaptive logic board 100) and/or the control panel 40 may send instructions to the first integrated circuit controller 228, via one or more control lines 238 of the first integrated circuit controller 228, that are associated with a particular resistor or resistors of the plurality of resistors 226. As such, the adaptive logic board 100 may select one or more resistors of the plurality of resistors 226 to electrically couple to the signal sensing circuit 219 via the first integrated circuit controller 228.

For example, in some embodiments, each control line of the one or more control lines 238 is associated with a corresponding one of the plurality of resistors 226. Specifically, in the illustrated embodiment, the one or more control lines 238 include a first control line 240, a second control line 242, a third control line 244, and a fourth control line 246, which are respectively associated with the first resistor 227, the second resistor 230, the third resistor 232, and the fourth resistor 234. Accordingly, the adaptive logic board 100 may, via the first control line 240, send a signal to the first integrated circuit controller 228 that instructs the first integrated circuit controller 228 to electrically couple the first resistor 227 (e.g., an active resistor) to the signal sensing circuit 219, while the second, third, and fourth resistors 230, 232, 234 remain electrically decoupled from the signal sensing circuit 219. Similarly, the adaptive logic board 100 may instruct the first integrated circuit controller 228 to electrically couple one of the second, third, or fourth resistors 230, 232, 234 to the signal sensing circuit 219 by sending a corresponding instruction signal to the first integrated circuit controller 228 via the second, third, or fourth control lines 242, 244, 246, respectively.

The adaptive logic board 100 and/or the control panel 40 may select the active resistor of the plurality of resistors 226 in accordance with the techniques discussed above. That is, the active resistor may be selected based on a size of the VSD 52 to which the adaptive logic board 100 is coupled. Moreover, it should be appreciated that in some embodiments, the adaptive logic board 100 and/or the control panel 40 may instruct the first integrated circuit controller 228 to electrically couple more than one of the plurality of resistors 226 to the signal sensing circuit 219. In such embodiments, the selected resistors of the plurality of resistors 226 that are electrically coupled to the signal sensing circuit 219 are collectively referred to as the active resistor.

Although the first integrated circuit controller 228 is shown as electrically coupled to four resistors 226 and four control lines 238 in the illustrated embodiment of FIG. 8, it should be noted that, in other embodiments, the first integrated circuit controller 228 may be electrically coupled to any suitable quantity of resistors 228 and corresponding control lines 238. That is, the first integrated circuit controller 228 may be electrically coupled to 1, 2, 3, 4, 5, 6, or more than 6 resistors 226, which are associated with 1, 2, 3, 4, 5, 6, or more than 6 control lines 238, respectively.

In some embodiments, the first integrated circuit controller 228 may be electrically coupled to a reference voltage terminal 248 (e.g., a positive voltage source) that is configured to facilitate operation of the first integrated circuit controller 228. As a non-limiting example, the reference voltage terminal 248 may be configured to supply a voltage differential between about zero Volts and about 20 Volts (e.g., 0 Volts±20 Volts) to the first integrated circuit controller 228. The first integrated circuit controller 228 may also be electrically coupled to a first power supply terminal 249 (e.g., a positive voltage source) and a second power supply terminal 250 (e.g., a negative voltage source), which may be configured to supply a voltage differential to the first integrated circuit controller 228 that is substantially equal to, or different than, a voltage differential supplied by the reference voltage terminal 248 (e.g., 0 Volts±20 Volts). Further, in certain embodiments, the first integrated circuit controller 228 may be electrically coupled to a plurality of additional electrical components, such as resistors 251 and capacitors 253, which enable effective operation of the first integrated circuit controller 228. It should be appreciated that each of the resistors 251 and/or each of the capacitors 253 may have different or substantially similar resistance values and capacitance values, respectively. In any case, the output line 236 of the first integrated circuit controller 228 is electrically coupled to an operational amplifier 256 (e.g., to a non-inverting input of the operational amplifier 256) via a line 258. As such, the operational amplifier 256 may evaluate the output signal generated by third output current transducer 146.

In the illustrated embodiment, the signal sensing circuit 219 includes a second integrated circuit controller 260 that is electrically coupled to a second plurality of resistors 262. As discussed in detail below, each resistor of the second plurality of resistors 262 may be associated with a corresponding resistor of the first plurality of resistors 226. That is, a first resistor 264 of the second plurality of resistors 262 may be associated with the first resistor 227, a second resistor 266 of the second plurality of resistors 262 may be associated with the second resistor 230, a third resistor 267 of the second plurality of resistors 262 may be associated with the third resistor 232, and a fourth resistor 268 of the second plurality of resistors 262 may be associated with the fourth resistor 234. In certain embodiments, resistors of the first plurality of resistors 226 corresponding to particular resistors of the second plurality of resistors 262 may include a substantially similar resistance value or a different resistance value relative to one another. For example, a resistance value of the first resistor 227 may be substantially equal to, or different than, a resistance value of the first resistor 264.

Similar to the first integrated circuit controller 228, the second integrated circuit controller 260 may be communicatively coupled to the adaptive logic board 100 and/or the control panel 40 via the control lines 238. In some embodiments, the control lines 238 are each associated with a corresponding resistor of the second plurality of resistors 262, thereby enabling the adaptive logic board 100 and/or the control panel 40 to instruct the second integrated circuit controller 260 to electrically couple or electrically decouple a particular resistor of the plurality of resistors 262 to the signal sensing circuit 219 in accordance with the techniques discussed above. The resistor of the plurality of resistors 262 that is electrically coupled to the signal sensing circuit 219 will be referred to herein as an "additional active resistor." The additional active resistor may be associated with a resistor (e.g., the active resistor) of the first plurality of resistors 226 that is electrically coupled to the signal sensing circuit 219 by the first integrated circuit controller 228. As an example, in embodiments where the adaptive logic board 100 transmits an instruction signal to the first and second integrated circuit controllers 228, 260 via the first control line 240, the first and second integrated circuit controllers 228, 260 may cooperate to electrically couple the first resistor 227 (e.g., the active resistor) and the first resistor 264 (e.g., the additional active resistor) to the signal sensing circuit 219. As discussed below, the additional active resistor may ensure that the operational amplifier 256 receives an appropriate reference voltage with which to compare a voltage signal provided via the signal line 150 (e.g., a signal output by the line 258).

In the illustrated embodiment, the second integrated circuit controller 260 includes an output line 270 that is electrically coupled to the operational amplifier 256 (e.g., to an inverting terminal of the operational amplifier 256) via line 272. Additionally, in some embodiments, the second integrated circuit controller 260 may be coupled to a plurality of additional electrical components, such as the resistors 251, the capacitors 253, the first power supply terminal 249, and/or the second power supply terminal 250, which are configured to facilitate effective operation of the first integrated circuit controller 260. In particular, the resistors 251 and the capacitors 253 may operate as a filter to mitigate fluctuations in voltage that may be provided by the reference voltage terminal 248 and/or the first and second power supply terminals 249, 250.

In some embodiments, the operational amplifier 256 may be electrically coupled to an additional power supply 273 (e.g., a positive voltage source) that is configured to supply a voltage differential (e.g., 0 Volts±20 Volts) that enables operation of the operational amplifier 256. The operational amplifier 256 may be configured to determine a voltage differential between a signal provided via the line 258 (e.g., a signal corresponding to the output signal generated by the third output current transducer 146) and a signal provided via the line 272 (e.g., a reference voltage signal). In particular, the operational amplifier 256 may output a differential voltage signal via an output line 274, which may be indicative of a magnitude of the output signal generated by third output current transducer 146. The adaptive sensing unit 221 may ensure that the voltage differential received by the operational amplifier 256 is within an effective operating range of the operational amplifier 256 by electrically coupling an appropriate resistor or resistors of the first plurality of resistors 226 and the second plurality of resistor 262 to the signal sensing circuit 219 based on the detected size of the VSD 52.

As such, the adaptive logic board 100 may determine a magnitude of the current flowing through the third output line 120 based on the magnitude of the differential voltage signal that is output via the output line 274. In some embodiments, the adaptive logic board 100 may instruct the VSD 52 to increase or decrease a magnitude of the electric current that is output by the VSD 52 when the differential voltage signal deviates from a target value by a threshold amount.

Figure 9:
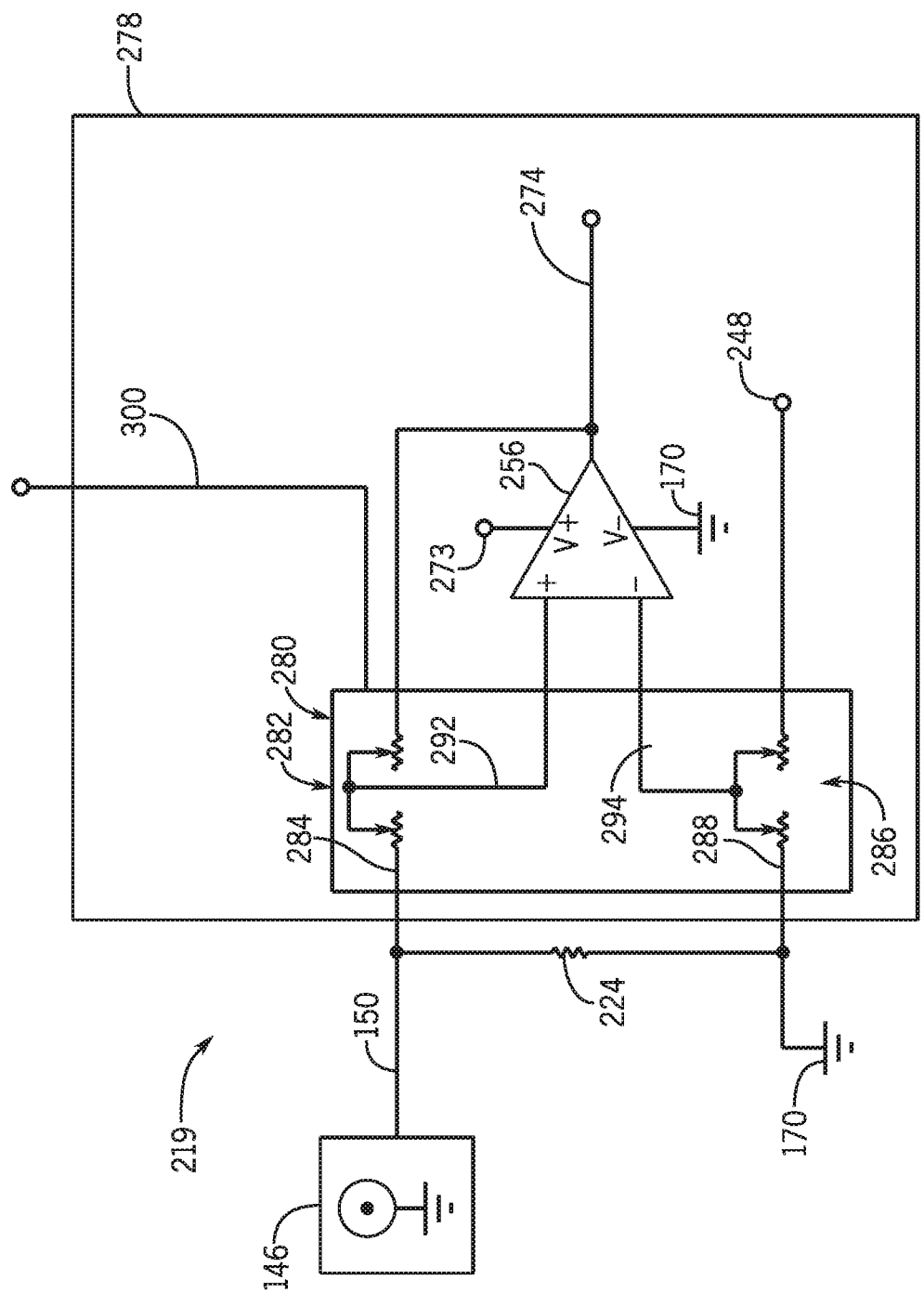
FIG. 9 is a schematic of an embodiment of a general configuration of a signal sensing circuit that may be included in the adaptive logic board, in accordance with an aspect of the present disclosure.

FIG. 9 is schematic diagram of another embodiment of an adaptive sensing unit 278 that may be included in the signal sensing circuit 219 of the adaptive logic board 100. In particular, the adaptive sensing unit 278 includes a programmable resistor 280 that is electrically coupled to the third output current transducer 146 and to the operational amplifier 256 (e.g., instead of the first plurality of resistors 226 and the second plurality of resistors 262 of the adaptive sensing unit 221). As shown in the illustrated embodiment, the programmable resistor 280 includes a first variable resistance element 282 that is electrically coupled to the signal line 150 via a first line 284, and includes a second variable resistance element 286 that is electrically coupled to the ground terminal 170 and the resistor 224 via a second line 288. The first variable resistance element 282 includes a first output line 292 that is electrically coupled to the non-inverting input of the operational amplifier 256. Similarly, the second variable resistance element 286 includes a second output line 294 that is electrically coupled to the inverting input of the operational amplifier 256. In some embodiments, the first variable resistance element 282 and the second variable resistance element 286 are programmable to provide a particular resistance value between the first line 284 and the first output line 292, and between the second line 288 and the second output line 294, respectively. Accordingly, the first and second variable resistance elements 282, 286 may ensure that the operational amplifier 256 operates effectively regardless of a magnitude of the output current supplied to the adaptive sensing unit 278 via the signal line 150.

For example, as noted above, the adaptive logic board 100 may recognize a size of the VSD 52 (e.g., via the identification code, via operator inputs through the input device 128) that is coupled to the adaptive logic board 100. Accordingly, the adaptive logic board 100 may determine an expected range of electrical current that may generated by the third output current transducer 146 during operation of the VSD 52, or in other words, an expected range of electrical current supplied to the resistor 224 via the signal line 150. Based on this determination, the adaptive logic board 100 may instruct the programmable resistor 280 to adjust respective resistance values of the first variable resistance element 282 and the second variable resistance element 286 to resistance values that enable the operational amplifier 256 to suitably measure the expected voltage drop across the resistor 224. In other words, the programmable resistor 280 may adjust a gain of the adaptive sensing unit 278, such that the operational amplifier 256 receives a voltage differential that is within a suitable operation range of the operational amplifier 256.

For example, the programmable resistor 280 may be communicatively coupled to the adaptive logic board 100 (e.g., to a controller of the adaptive logic board 100) via a control line 300 that enables the adaptive logic board 100 to specify particular resistance values for the first and second variable resistance elements 282, 286 based on the detected size of the VSD 52. Accordingly, a signal provided to the operational amplifier 256 via the line 292 (e.g., a signal corresponding to the output signal generated by the third output current transducer 146) and a signal provided to the operational amplifier 256 via the line 294 (e.g., a reference voltage signal) may each include a voltage magnitude and/or a current magnitude that is within a suitable operating range of the operational amplifier 256, thereby enhancing an effectiveness of the operational amplifier 256. Indeed, if respective resistance values of the first and second variable resistance elements 282, 286 are above or below threshold resistance values that are suitable to receive the electrical current supplied by the signal line 150, then the first and second output 292, 294 lines may provide the operational amplifier 256 with respective output voltages that exceed or fall below an effective operating range of the operational amplifier 256.

The first and second variable resistance elements 282, 286 are each adjustable to multitudinous discrete resistance values, thereby enabling the operational amplifier 256 to receive input signals (e.g., via the lines 292, 294) at particular magnitudes that may enhance the operational effectiveness of the operational amplifier 256. Indeed, in some embodiments, the first and second variable resistance elements 282, 286 are each adjustable to provide one of 2, 3, 4, 5, 10, 20, 50, or more than 50 discrete selectable resistance values between the first line 284 and the first output line 292, and between the second line 288 and the second output line 294, respectively. In this manner, the adaptive logic board 100 may selectively configure the adaptive sensing unit 278 to suitably monitor operating parameters of various sizes of the VSD 52.

Accordingly, as similarly discussed above with reference to FIG. 8, the operational amplifier 256 may compare a voltage differential between a signal provided via the first output line 292 and a signal provided via the second output line 294 to generate a differential voltage signal, which is output via the output line 274. As such, a magnitude of the differential voltage signal may be indicative of a magnitude of the output signal generated by third output current transducer 146, and thus, a magnitude of the current flowing through the third output line 120.

Figure 10:
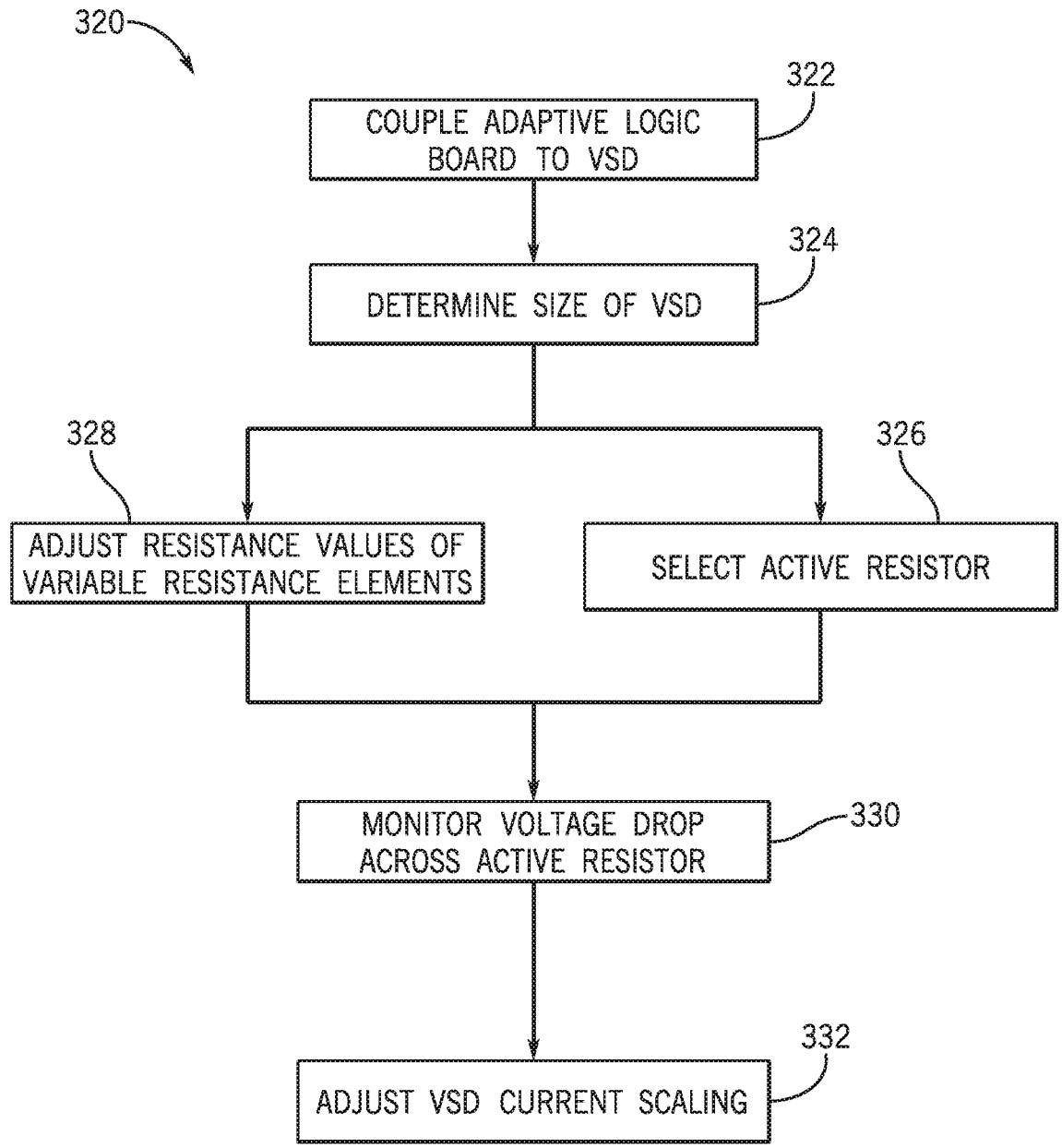
FIG. 10 is a block diagram of an embodiment of a method of operation for the adaptive logic board, in accordance with an aspect of the present disclosure.

FIG. 10 is an embodiment of a method 320 of controlling the VSD 52 using the adaptive logic board 100. For example, at block 322, the adaptive logic board 100 may be communicatively coupled to the VSD 52 using the harness 124. The harness 124 may enable the transfer of data signals and/or electrical current from the VSD 52 to the adaptive logic board 100, or vice versa. At block 324, the adaptive logic board 100 may determine a size (e.g., a power output rating) of the VSD 52. As discussed above, the VSD 52 may transmit an identification code to the adaptive logic board 100 (e.g., through the harness 124), which is indicative of the size of the VSD 52. In some embodiments, the identification code may be stored within the harness 124 itself (e.g., through a memory device disposed within the harness 124). In any case, the adaptive logic board 100 may use the identification code to determine whether the VSD 52 may be, for example, relatively small, relatively middle-sized, or relatively large. Further, in some embodiments, the adaptive logic board 100 may determine a size of the VSD 52 based on an operator input that may be provided via the input device 128 (e.g., an operator may manually specify a size of the VSD 52 via the input device 128).

In certain embodiments, a quantity of established connections (e.g., using the harness 124) between the VSD 52 and the adaptive logic board 100 may enable the adaptive logic board 100 to determine the size of the VSD 52 in addition to, or in lieu of, the identification code. For example, a relatively large VSD 52 may include a first quantity of output terminals to which the harness 124 may electrically couple. As such, the harness 124 may additionally couple to a first quantity of input terminals of the adaptive logic board 100. The adaptive logic board 100 may determine a quantity of input terminals that are communicatively coupled to the VSD 52 and a quantity of input terminals that are vacant (e.g., not commutatively coupled to the VSD), and thus determine a size of the VSD 52 based on the coupled and/or vacant input terminals. For example, the first quantity of established connections may be associated with a relatively large VSD. Conversely, a relatively small VSD may be associated with the second quantity of established connections.

At block 326, the adaptive logic board 100 may select, and electrically couple, a resistor (e.g., the active resistor) of the one or more resistors 154 or a resistor the plurality of resistors 226 to the signal sensing circuit 153 and/or 219. The active resistor may be indicative of a resistor (e.g., one of the resistors 164, 166, 168, 227, 230, 232, 234) that is configured to receive a respective output signal generated by one of the input current transducers 130 or one of the output current transducers 140. In embodiments of the adaptive logic board 100 that include the signal sensing circuit 219, the adaptive logic board 100 may additionally select, and electrically couple, a resistor (e.g., the additional active resistor) of the plurality of resistors 262 to the signal sensing circuit 219. As noted above, the additional active resistor may be associated with the active resistor and configured to provide a suitable reference voltage signal to the operational amplifier 256. Further, in embodiments of the adaptive logic board 100 that include the adaptive sensing unit 278, the adaptive logic board 100 may instruct the first and second variable resistance elements 282, 286 to provide a particular resistance value that corresponds to a detected size of the VSD 52, as indicated by block 328. That is, the adaptive logic board 100 may instruct the programmable resistor 280 to adjust a magnitude of the resistance values provided by the first and second variable resistance elements 282, 286, instead of electrically coupling or electrically decoupling particular resistor(s) to the signal sensing circuit 153 and/or 219.

In any case, as discussed above, each of the input and output current transducers 130 and 140 may be electrically coupled to a corresponding signal sensing circuit 152. As such, each of the signal sensing circuits 152 may be used to monitor a magnitude of the output signal generated by a respective input current transducer (e.g., one of the first, second, or third input current transducers 132, 134, or 136) or a respective output current transducer (e.g., one of the first, second, or third output current transducers 142, 144, or 146), and thus, a magnitude of the electrical current flowing through a respective one of the receiving or output lines 104, 106, 108, 116, 118, and/or 120. In other words, the adaptive logic board 100 may monitor the magnitude of each phase of AC power drawn by the VSD 52 from the AC power source 102, and monitor the magnitude of each phase of AC power that the VSD 52 supplies to the motor 50, by evaluating the voltage drop across the respective active resistors, as indicated by block 330. In embodiments of the adaptive logic board 100 that include the signal sensing circuit 219, the adaptive logic board 100 may monitor the magnitude of each phase of AC power drawn by the VSD 52 from the AC power source 102, and monitor the differential voltage magnitude of each phase of AC power that the VSD 52 supplies to the motor 50, via evaluation of the output signal generated by the operational amplifiers 256.

At block 332, the adaptive logic board 100 may instruct the VSD 52 to adjust a flow of electrical current through any of the first, second, or third receiving lines 104, 106, and/or 108 and/or any of the first, second, or third output lines 116, 118, and/or 120 when the flow of electrical current through the receiving or output lines 104, 106, 108, 116, 118, and/or 120 deviates from a target value by more than a predetermined amount. For example, if the adaptive logic board 100 determines that a magnitude of the electrical current supplied to the motor 50 via the third output line 120 is below a target value, the adaptive logic board 100 may instruct the VSD 52 to increase the magnitude of this electrical current (e.g., using the DC link 112). Accordingly, the adaptive logic board 100 may monitor and/or regulate the flow of electrical current to and/or from the VSD 52 regardless of a size of the VSD 52.

It should be understood that the application is not limited to the details or methodology set forth in the following description or illustrated in the figures. It should also be understood that the phraseology and terminology employed herein is for the purpose of description only and should not be regarded as limiting.

While the exemplary embodiments illustrated in the figures and described herein are presently preferred, it should be understood that these embodiments are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

It is important to note that the construction and arrangement of the medium voltage synchronous transfer system as shown in the various exemplary embodiments is illustrative only. Although only a few embodiments have been described in detail in this disclosure, those who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

The invention claimed is:

1. An adaptive logic board, comprising:
   a signal sensing circuit configured to receive an input signal as an electrical current, wherein the signal sensing circuit is configured to receive the input signal from a variable speed drive (VSD), and the signal sensing circuit comprises:
      a plurality of resistors; and
      a plurality of switches configured to electrically couple or electrically decouple the plurality of resistors from the signal sensing circuit, wherein each switch of the plurality of switches corresponds to a corresponding resistor of the plurality of resistors; and
   a sensing unit, wherein the sensing unit is configured to measure a voltage drop of the input signal across an active resistor of the plurality of resistors.

2. The adaptive logic board of claim 1, wherein the input signal is generated by a current transducer disposed about a power line.

3. The adaptive logic board of claim 1, wherein each resistor of the plurality of resistors has a different nominal resistance value.

4. The adaptive logic board of claim 1, wherein a switch of the plurality of switches is configured to electrically couple a single resistor of the plurality of resistors to the signal sensing circuit, and wherein the single resistor is the active resistor.

5. The adaptive logic board of claim 4, wherein the active resistor is determined based at least in part on a magnitude of the input signal.

6. The adaptive logic board of claim 4, wherein the active resistor is determined based on a predetermined identification code, and wherein the predetermined identification code is transmitted to the adaptive logic board via a harness.

7. The adaptive logic board of claim 1, wherein a current transducer is disposed about a power line of the VSD, and wherein the current transducer generates the input signal based on a flow of electrical current within the power line.

8. The adaptive logic board of claim 7, wherein the active resistor is selected based on a first magnitude of the input signal, and wherein the adaptive logic board is configured to instruct the VSD to adjust a second magnitude of the flow of electrical current within the power line when the voltage drop across the active resistor deviates from a target value by a predetermined amount.

9. The adaptive logic board of claim 1, comprising a plurality of signal sensing circuits that are each configured to receive a respective input signal from a current transducer of a plurality of current transducers, wherein each current transducer of the plurality of current transducers is disposed about a respective power line of the VSD.

10. The adaptive logic board of claim 1, wherein at least one switch of the plurality of switches comprises a Metal-Oxide Semiconductor Field-Effect Transistor.

* * * * *